United States Patent
Gardner et al.

[11] Patent Number: 6,008,095
[45] Date of Patent: Dec. 28, 1999

[54] PROCESS FOR FORMATION OF ISOLATION TRENCHES WITH HIGH-K GATE DIELECTRICS

[75] Inventors: Mark I. Gardner, Cedar Creek; H. Jim Fulford; Charles E May, both of Austin, all of Tex.

[73] Assignee: Advanced Micro Devices, Inc., Sunnyvale, Calif.

[21] Appl. No.: 09/130,766

[22] Filed: Aug. 7, 1998

[51] Int. Cl.⁶ .................. H01L 21/8242; H01L 21/70
[52] U.S. Cl. .................. 438/296; 438/240; 438/287
[58] Field of Search .................. 438/240, 261, 438/287, 296, 359, 582, 591

[56] References Cited

U.S. PATENT DOCUMENTS

| | | | |
|---|---|---|---|
| 5,292,673 | 3/1994 | Shinriki et al. | 438/287 |
| 5,420,060 | 5/1995 | Gill et al. | 438/261 |
| 5,679,599 | 10/1997 | Mehta . | |
| 5,741,722 | 4/1998 | Lee | 438/240 |
| 5,763,310 | 6/1998 | Gardner . | |
| 5,777,370 | 7/1998 | Omid-Zohoor et al. . | |
| 5,786,256 | 7/1998 | Gardner et al. . | |
| 5,834,348 | 10/1998 | Kwon et al. | 438/240 |

*Primary Examiner*—Charles Bowers
*Assistant Examiner*—David S Blum

[57] ABSTRACT

A process for formation of isolation trenches with high-k gate dielectrics. In an example embodiment, the process comprises depositing a high permittivity layer on the substrate. An isolation trench extending from the high permittivity layer into the substrate is etched at a selected location on the substrate. The high permittivity layer is then etched to a selected thickness, and gate electrodes are formed adjacent the trench on the high permittivity layer of the selected thickness. In another embodiment, the isolation trench is formed with an oxide liner using an NO anneal, and the high-K gate dielectric layer is optionally reduced in thickness.

30 Claims, 3 Drawing Sheets

PROCESS FOR FORMATION OF ISOLATION TRENCHES WITH HIGH-K GATE DIELECTRICS

FIELD OF THE INVENTION

The present invention is directed generally to semiconductor structures and, more particularly, to the process integration of formation of isolation trenches with formation of gate dielectrics using high-K materials.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicability and numerous disciplines. One such silicon-based semiconductor device is a metal-oxide-semiconductor (MOS) transistor.

A typical MOS semiconductor device generally includes a gate electrode, which acts as a conductor, to which an input signal is typically applied via a gate terminal. Heavily doped source/drain regions are formed in a semiconductor substrate and are respectively connected to source and drain terminals. A channel region is formed in the semiconductor substrate beneath the gate electrode and separates the source/drain regions. The channel is typically lightly doped with a dopant type opposite that of the source/drain regions. The gate electrode is physically separated from the semiconductor substrate by a gate insulating layer, typically an oxide layer such as $SiO_2$. The insulating layer is provided to prevent current from flowing between the gate electrode and the source/drain regions or channel region.

In operation, an output voltage is typically developed between the source and drain terminals. When an input voltage is applied to the gate electrode, a transverse electric field is set up in the channel region. By varying the transverse electric field, it is possible to modulate the conductance of the channel region between the source region/drain regions. In this manner an electric field controls the current flow through the channel region. This type of device is commonly referred to as a MOS field-effect-transistors (MOSFET).

Semiconductor devices, like the one described above, are used in large numbers to construct most modern electronic devices. In order to increase the capability of such electronic devices, it is necessary to integrate ever increasing numbers of such devices into a single silicon wafer. As the semiconductor devices are scaled down (i.e., made smaller) and in order to form a larger number of devices on a given surface area, the structure of the devices and fabrication techniques used to make such devices must be altered.

One important step in the manufacture of MOS devices is the formation of the gate insulating layer. The gate insulating layer is typically formed by growing an oxide, typically $SiO_2$, over the surface of the substrate. It is important to carefully control the growth of the gate oxide layer because the thickness and uniformity of the gate oxide layer can significantly impact the overall operation of the device being formed. For example, the drive current in a MOS transistor is inversely proportional to the gate oxide thickness at a given set of terminal voltages. Accordingly, it is normally desired to increase the drive current of the transistor by making the gate oxide as thin as possible, taking into consideration the oxide breakdown and reliability considerations of the process and technology being used.

The above described conventional techniques for forming gate oxide layers impose limitations on the minimum thickness of the gate oxide layer and on the ability to control the uniformity of the gate oxide layer. As the thresholds for minimum thickness and uniformity control are reached, the ability to further scale down the semiconductor devices is hindered.

SUMMARY OF THE INVENTION

Generally, the present invention relates to a process that integrates formation of an isolation trench with formation of gate structures having gate dielectrics comprised of high permittivity material instead of an oxide layer such as $SiO_2$.

The invention is a process for forming a semiconductor structure in one embodiment of the invention. The process comprises: depositing a high permittivity layer on the substrate; forming an isolation trench extending from the high permittivity layer into the substrate at a selected location on the substrate; etching away the high permittivity layer to a selected thickness; and forming gate electrodes adjacent the trench on the high permittivity layer of the selected thickness.

In another embodiment, the invention is a process for forming a semiconductor structure on a silicon substrate. The process comprises: depositing a high permittivity layer on the substrate; forming a trench through the high permittivity layer and in the substrate at a selected location on the substrate; depositing oxide in the trench; forming gate electrodes adjacent the trench on the high permittivity layer; implanting a first concentration of a first dopant species into the substrate; depositing a layer of spacer material over the high permittivity layer and the gate electrodes; forming spacers adjacent to the gate electrodes; removing the high permittivity layer between spacers of adjacent gate electrodes; and implanting a second concentration of a second dopant species into the substrate.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
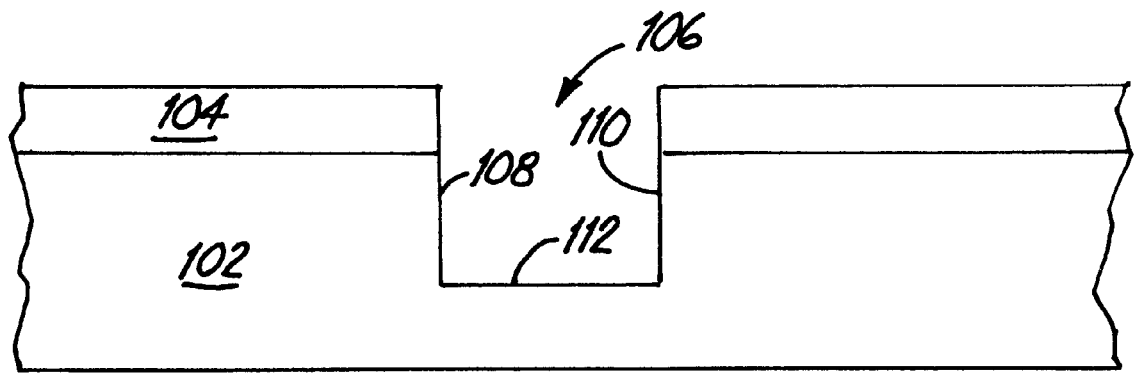
FIG. 1 is a partial cross-sectional view of a semiconductor substrate upon which a trench and adjacent transistors are to be formed.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of semiconductor transistor arrangements. The invention has been found to be particularly advantageous in applications where it is desirable to integrate formation of isolation trenches with formation of transistors having gate insulators comprised of high permittivity materials, such as in PMOS, NMOS, CMOS, and BiCMOS devices. While the present invention is not so limited, an appreciation of various aspects of the invention is best gained through a discussion of various application examples of processes used to form such semiconductor devices.

FIGS. 1–4B illustrate semiconductor structures at various stages in a process flow in accordance with example embodiments of the invention. FIG. 1 is a partial cross-sectional view of a semiconductor substrate 102 upon which a trench and adjacent transistors are to be formed. In an example CMOS embodiment, the substrate 102 is a p+ silicon bulk which incorporates p-well and n-well regions. The well formation process is suitably accomplished by implanting selected impurity distributions into the appropriate well regions in conjunction with conventional masking steps. For example, for p-well regions ions of boron are implanted, and for n-well regions ions of phosphorous are implanted.

A gate dielectric layer 104 is deposited on the surface of the substrate 102. In the example embodiment, the gate dielectric layer is comprised of a high permittivity material which is also referred to herein as "high-K" material. Depositing the high-K material directly on the substrate eliminates steps of other alternative processes where an oxy-nitride stack is formed and then nitride layers are selectively removed.

The high-K layer 104 may be formed from a number of different materials as provided below, wherein the dielectric constant (i.e., permittivity) of the high permittivity gate insulating layer varies depending on the type of material used. The dielectric constant of the high permittivity gate insulating layer is typically greater than that of silicon dioxide (dielectric constant of about 4.2) which is normally used to form conventional gate insulating layers. Such high permittivity materials include, for example, barium strontium titanate (BST) ($Ba_{1-x}Sr_xO_3$) having a dielectric constant between about 20 to 200, tantalum oxide ($Ta_xO_y$) having a dielectric constant ranging from about 20 to 200, lead zinc niobate (PZN) ($PbZn_xNb_{1-x}O_3$) having a dielectric constant of about 7,333 and lead scandium tantalum oxide (PST) ($PbSc_xTa_{1-x}O_3$) having a dielectric constant of about 3,000. It will be appreciated that the dielectric constant values given above are approximate only and can vary with the process techniques used to form and measure the permittivity of the materials. A more detailed discussion of the formation of gate insulating layers using relatively high permittivity materials and the types of high permittivity materials which may be used are provided in U.S. patent application Ser. No. 08/920,384, entitled "Semiconductor Device Having High Permittivity Gate Insulating Layer And Method Of Manufacturing Thereof," filed Aug. 29, 1997, the contents of which are herein incorporated by reference.

In one particular embodiment, the gate dielectric layer 104 or "high permittivity layer" is formed using a conventional sputter deposition process. The thickness of the high permittivity layer 104 is selected in consideration of the desired characteristics of the insulative layers as well as in consideration of reliability concerns. Example thicknesses range from about 100 to 3000 Å. While these thicknesses are substantially thicker than present $SiO_2$ gate oxide thicknesses, it will be appreciated that as compared to $SiO_2$ thickness for comparable dielectric constants, the thickness of the high permittivity gate insulating layer 104 can be lower than conventional $SiO_2$ gate insulating layers. For example, 16 Å of a tantalum oxide ($Ta_xO_y$) having a dielectric constant of about 25 is equivalent to 4.0 Å of silicon dioxide having a dielectric constant of 4.2.

A photoresist mask pattern (not shown) is formed over the high permittivity layer 104 to pattern the trench area. Then the trench 106 is etched, first by etching the high-K layer 104 and then by etching the silicon substrate 102 to a desired depth. The etch of the high-K layer 104 can be achieved with a $CHF_3$ and Argon etch. The substrate 102 can be etched with a plasma anisotropic etch process in which the plasma contains fluorine or chlorine. The resulting trench 106 includes sidewalls 108 and 110 and a base 112. The photoresist material is stripped to yield the structure of FIG. 1. It will be appreciated that the shape of the trench as shown is for illustration purposes only. Those skilled in the art will recognize that the trench may assume other shapes and proportions.

Figure 2A:
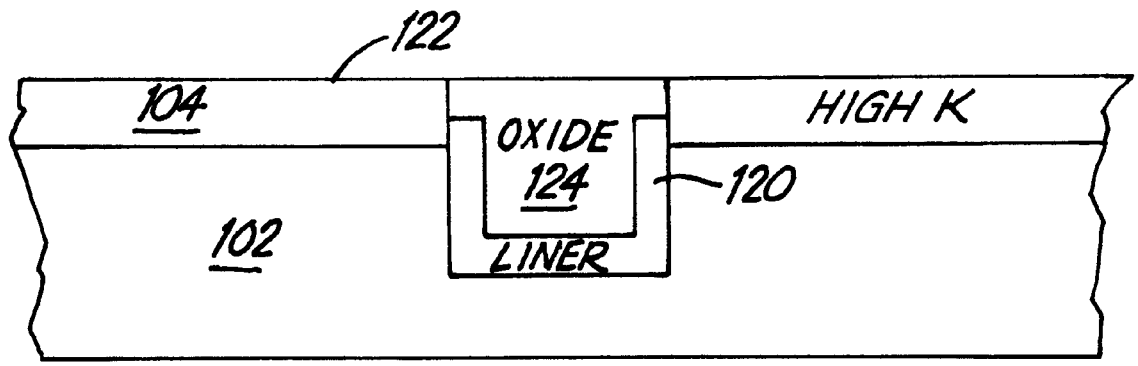
FIG. 2A is a partial cross-sectional view of a semiconductor structure having a trench filled with a trench liner and trench oxide formed in accordance with an example embodiment of the invention.

FIG. 2A is a partial cross-sectional view of a semiconductor structure formed in accordance with an example embodiment of the invention. After the trench 106 of FIG. 1 is formed, a liner oxide 120 is formed by NO oxidation. This provides a very high quality dielectric layer with silicon-nitrogen bonds. The NO oxidation also permeates the high-K layer 104. The annealing process for growing the liner also passivates the top surface of the high permittivity layer and the sides with nitrogen, thereby inhibiting oxidation induced by the high permittivity layer when contacted with silicon materials such as those in the substrate 102 and in polysilicon gate conductors.

The liner oxide 120 is formed with a growth technique, for example, an oxygen ambient using a temperature range of approximately 1000°–1150° C. For an RTA sequence, the duration would be from about 1–5 minutes. A diffusion tube sequence would be about 20–40 minutes.

The integration of the high-K layer 104 with the formation of the trench liner 120 is believed to provide for shallower junctions. This is because the relatively thick high-K layer 104 provides a relatively deeper implant into subsequent polysilicon structures and a shallower implant into the substrate 102.

The NO oxidation is followed by an oxide deposition that fills the remainder of the trench region 106. In an example embodiment, an isolation delectric layer, such as an oxide, (not shown) is deposited on the surface 122 of the high-K layer 104 sufficient to fill the trench 106. The deposition of the isolation dielectric layer can be achieved with the use of a chemical vapor deposition process using a TEOS or silane source. After the isolation layer is deposited, the top surface of the structure is planarized, for example with a chemical-mechanical polish, and the structure of FIG. 2A results. It will be appreciated that the oxide 124 is selective to the high-K layer during polishing.

Figure 3A:
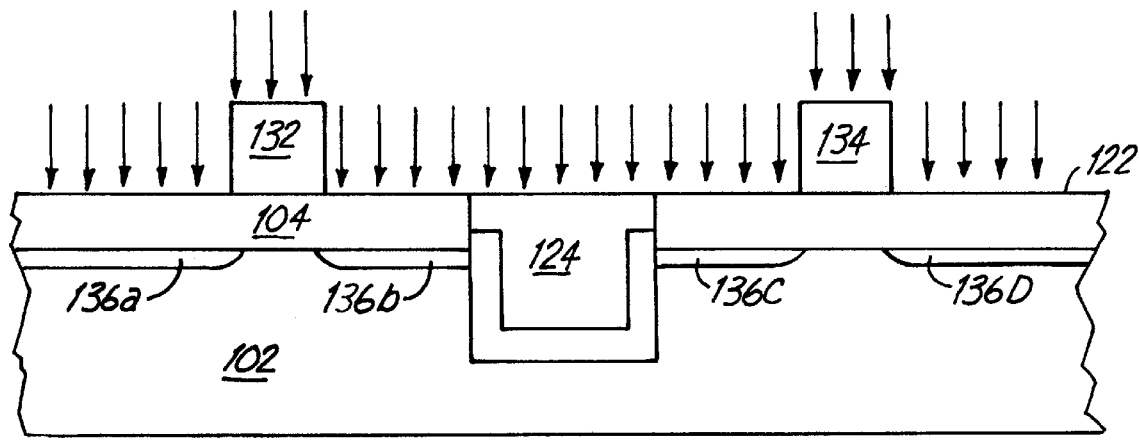
FIG. 3A is a partial cross-sectional view of a semiconductor structure including gate electrodes formed on the high-K gate dielectric layer according to an example process sequence.

FIG. 3A is a partial cross-sectional view of a semiconductor structure including gate electrodes 132 and 134 according to an example process sequence, wherein the oxide portion 124 is polished and the high permittivity layer is not etched, as shown in FIG. 2A. In an example embodiment, a gate conductive layer (not shown) is deposited on the surface 122 of the high-K layer 104. The deposition is accomplished by blanket depositing polysilicon in a chemical vapor deposition process and thereafter doping the polysilicon such that the gate conductive layer comprises a highly doped polysilicon film. For purposes of this disclosure, "highly doped polysilicon" is defined as polysilicon having a sheet resistance less than 500 Ohms/sq. Alternatively, the gate conductive layer may comprise titanium nitride, titanium tungsten, or other conductive material compatible with the process sequence.

The gate conductive layer is planarized with a chemical-mechanical polish, possibly in combination with photomask steps and dry etch steps to produce gate electrodes 132 and 134. Next, an LDD implant is performed with a first dopant species into the respective source and drain regions. The LDD implant areas are designated as 136$a$–$d$. In an example embodiment, the ion concentration of the LDD implant is in the range of approximately 8E14 to 3E15 ions/cm$^2$, and the implant energy can range from approximately 0.5 KeV to 5 KeV. The first dopant species may be ions of boron, phosphorus, or arsenic, for example.

Figure 4A:
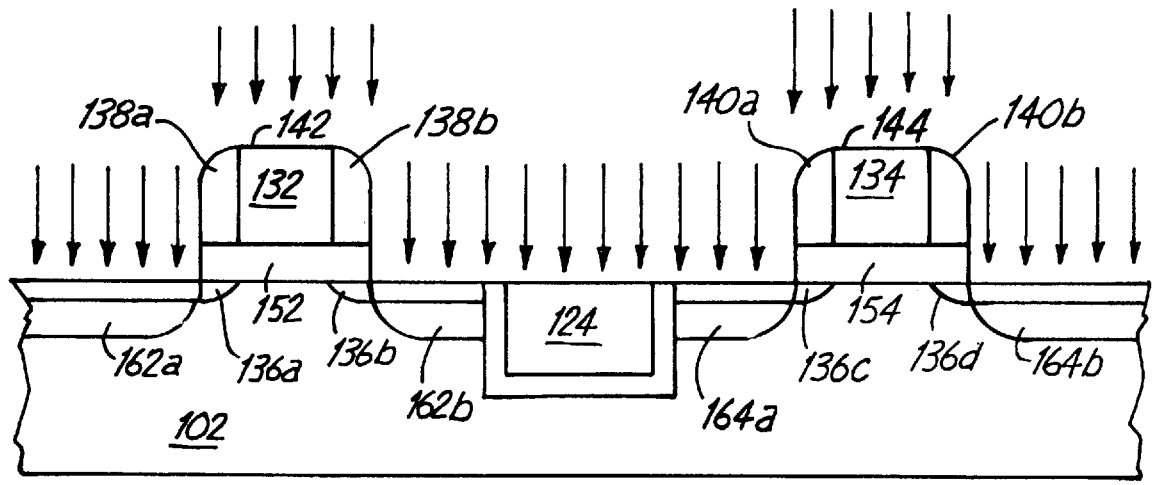
FIG. 4A is a partial cross-sectional view of a semiconductor structure in which spacers have been formed around the gate electrodes.

Continuing now with FIG. 4A, a partial cross-sectional view is shown of a semiconductor structure in which spacers 138$a$–$b$ and 140$a$–$b$ have been formed around the gate electrodes 132 and 134, respectively. The process sequence of FIG. 4A follows the processing sequence of FIG. 3A. In a first stage, spacer material is deposited over the high-K layer 104 (FIG. 3A) and over the gate electrodes 132 and 134. In an example embodiment, the spacer material is comprised of a CVD oxide film. The spacer material is then planarized with the surfaces 142 and 144 of gates 132 and 134, masked with a photoresistive material to shield the spacers 138$a$–$b$ and 140$a$–$b$, and etched. Removal of the spacer material leaves spacers 138$a$–$b$ and 140$a$–$b$, and thereafter the photoresistive material is removed.

Following removal of the photoresistive material, the high-K layer is etched, as masked by the gate electrodes 132 and 134 and the spacers 138$a$–$b$ and 140$a$–$b$. Thus, the high-K material that remains forms the gate dielectric portions 152 and 154. The high-K material can be plasma etched or wet etched using HF, for example.

A second concentration of a second dopant species is introduced to form the source and drain regions 162$a$ and 162$b$ and 164$a$ and 164$b$. The second dopant species may be ions of boron, phosphorus, or arsenic, for example, implanted at an energy level that ranges from approximately 0.2 KeV to 5 KeV and an ion concentration of approximately 2E15–6 E15 ions/cm$^2$.

Figure 2B:
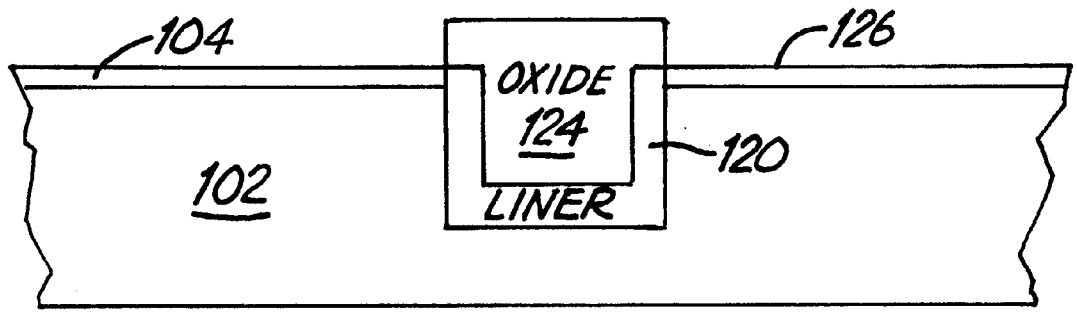
FIG. 2B is a partial cross-sectional view of a semiconductor structure having a trench filled with a trench liner and a trench oxide, wherein the thickness of the high-K gate dielectric layer is reduced, according to another example embodiment of the invention.
Figure 3B:
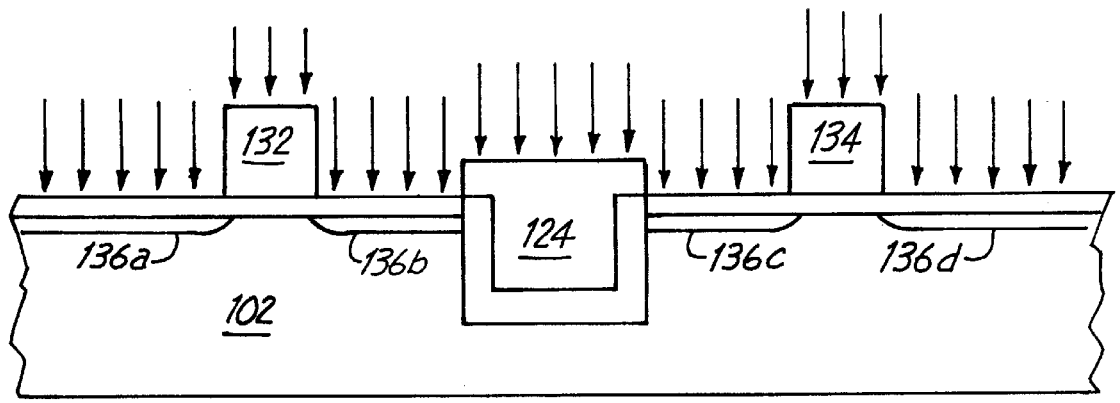
FIG. 3B is a partial cross-sectional view, according to an example embodiment, of a semiconductor structure including gate electrodes formed on the reduced thickness high-K gate dielectric layer.
Figure 4B:
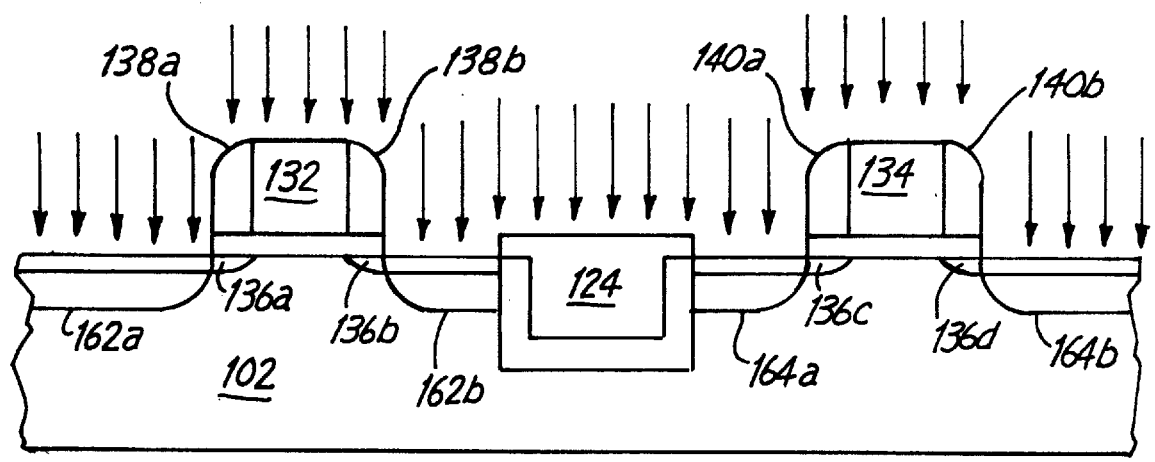
FIG. 4B is a partial cross-sectional view of a semiconductor structure in which spacers have been formed around the gate electrodes formed on the reduced thickness gate dielectric layer.

FIGS. 2B, 3B, and 4B are cross-sectional views of semiconductor structures according to an alternative example embodiment, wherein the high-K layer 104 is etched after planarizing the trench oxide 124 and before forming spacers beside the gate electrodes. FIG. 2B is a partial cross-sectional view of a semiconductor structure in which, after the polishing shown in FIG. 2A is performed, a plasma etch or a wet HF etch is performed to reduce the thickness of the high-K layer 104. This leaves the oxide portion 124 of the trench isolation structure slightly elevated relative to the surface 126 of the high-K layer. After the thickness of the high-K layer 104 is reduced, the process sequence as illustrated with FIGS. 3B and 4B is the same as that described above in reference to FIGS. 3A and 4A. Fabrication continues with well-known processes, such as silicidation and contact formation to form the final structure.

With regard to the above described example embodiments, plasma reduction of the thickness of the high-K layer followed by deposition of the polysilicon layer is not believed to have been done before. Furthermore, where the high-K layer 104 is exposed during the NO anneal that forms the trench liner 120, the NO anneal passivates the top surface of the high-K layer with nitrogen. The NO also passes through the high-K layer 104 to the silicon substrate surface. This reduces the oxidation at the interfaces between the high-K layer and the substrate 102 and polysilicon embodiments of gate electrodes 132 and 134. Without the protective nitrogen at the interfaces, the high-K layer 104 would grow during subsequent processing because of oxygen bearing species present in the high-K material.

As noted above, the present invention is applicable to fabrication of a number of different devices. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and devices.

We claim:

1. A process for forming a semiconductor structure on a silicon substrate, comprising:
   depositing a high permittivity layer on the substrate;
   wherein the high permittivity layer material has a dielectric constant of at least 20;
   forming an isolation trench extending from the high permittivity layer into the substrate at a selected location on the substrate;
   etching away the high permittivity layer to a selected thickness; and
   forming gate electrodes adjacent the trench on the high permittivity layer of the selected thickness.

2. The process of claim 1, further comprising:
   implanting a first concentration of a first dopant species into the substrate after formation of the gate electrodes;
   forming spacers on the high permittivity layer beside the gate electrodes;
   removing the high permittivity layer between spacers of adjacent gate electrodes; and
   implanting a second concentration of a second dopant species into the substrate.

3. The process of claim 2, wherein etching comprises plasma etching the high permittivity layer.

4. The process of claim 3, further comprising depositing a polysilicon layer over the high permittivity layer after etching the high permittivity layer.

5. The process of claim 1, wherein the high permittivity layer is comprised of material selected from the group of barium strontium titanate, tantalum oxide, lead zinc niobate, and lead scandium tantalum oxide.

6. The process of claim 1, wherein the gate electrodes comprise highly doped polysilicon.

7. The process of claim 1, wherein the gate electrodes comprise a metal.

8. The process of claim 1, wherein the gate electrodes comprise titanium nitride.

9. The process of claim 1, wherein the gate electrodes comprise titanium tungsten.

10. A process for forming a semiconductor structure on a silicon substrate, comprising:

depositing a high permittivity layer on the substrate;

wherein the high permittivity layer material has a dielectric constant of at least 20;

forming a trench through the high permittivity layer and in the substrate at a selected location on the substrate;

depositing oxide in the trench;

forming gate electrodes adjacent the trench on the high permittivity layer;

implanting a first concentration of a first dopant species into the substrate;

forming spacers on the high permittivity layer beside the gate electrodes;

removing the high permittivity layer between spacers of adjacent gate electrodes; and implanting a second concentration of a second dopant species into the substrate.

11. The process of claim 10, further comprising:

planarizing the oxide in the trench with the high permittivity layer; and reducing the high permittivity layer to a selected thickness before forming the gate electrodes.

12. The process of claim 11, wherein reducing comprises plasma etching the high permittivity layer.

13. The process of claim 12, further comprising depositing a polysilicon layer over the high permittivity layer after etching the high permittivity layer.

14. The process of claim 11, further comprising oxidizing walls of the trench in the presence of NO gas prior to depositing oxide in the trench.

15. The process of claim 10, further comprising oxidizing walls of the trench in the presence of NO gas prior to depositing oxide in the trench.

16. The process of claim 10, wherein the high permittivity layer is comprised of barium strontium titanate.

17. The process of claim 10, wherein the high permittivity layer is comprised of tantalum oxide.

18. The process of claim 10, wherein the high permittivity layer is comprised of lead zinc niobate.

19. The process of claim 10, wherein the high permittivity layer is comprised of lead scandium tantalum oxide.

20. The process of claim 10, wherein the gate electrodes comprise highly doped polysilicon.

21. The process of claim 10, wherein the gate electrodes comprise a metal.

22. The process of claim 10, wherein the gate electrodes comprise titanium nitride.

23. The process of claim 10, wherein the gate electrodes comprise titanium tungsten.

24. The process of claim 10, wherein the first dopant species is selected from the group of boron, phosphorus, or arsenic.

25. The process of claim 24, wherein the first concentration of the first dopant species is in the range of approximately 8e14–3e15 ions/cm$^2$.

26. The process of claim 25, wherein the first dopant species is implanted with an energy level in the range of approximately 0.5 KeV to 5 KeV.

27. The process of claim 24, wherein the second dopant species is selected from the group of boron, phosphorus, or arsenic.

28. The process of claim 27, wherein the second dopant species is implanted with an energy level in the range of approximately 0.2 KeV to 5 KeV.

29. The process of claim 28, wherein the second dopant species is implanted with a dose rate of approximately 2E15–6 E15 ions/cm$^2$.

30. The process of claim 10, wherein the high permittivity layer has a dielectric constant of at least 20.

* * * * *